US009536705B2

(12) United States Patent
Iizuka

(10) Patent No.: US 9,536,705 B2
(45) Date of Patent: Jan. 3, 2017

(54) METHOD FOR CORRECTING DRIFT OF CHARGED PARTICLE BEAM, AND CHARGED PARTICLE BEAM WRITING APPARATUS

(71) Applicant: NUFLARE TECHNOLOGY, INC., Yokohama (JP)

(72) Inventor: Osamu Iizuka, Yokohama Kanagawa (JP)

(73) Assignee: NUFLARE TECHNOLOGY, INC., Yokohama (JP)

( * ) Notice: Subject to any disclaimer, the term of this patent is extended or adjusted under 35 U.S.C. 154(b) by 0 days.

(21) Appl. No.: 14/657,613

(22) Filed: Mar. 13, 2015

(65) Prior Publication Data

US 2015/0270101 A1 Sep. 24, 2015

(30) Foreign Application Priority Data

Mar. 19, 2014 (JP) ................................. 2014-056400

(51) Int. Cl.
*H01J 37/00* (2006.01)
*H01J 37/317* (2006.01)

(52) U.S. Cl.
CPC .. *H01J 37/3174* (2013.01); *H01J 2237/30455* (2013.01); *H01J 2237/30483* (2013.01); *H01J 2237/31776* (2013.01); *H01J 2237/31793* (2013.01)

(58) Field of Classification Search
CPC .... H01J 37/3045; H01J 37/3174; H01J 37/20; H01J 37/3053; H01J 2237/31776; H01J 2237/31793; H01J 2237/063; H01J 2237/303; H01J 2237/20285; H01J 2237/15
USPC ........................ 250/492.1–492.3, 396 R, 398
See application file for complete search history.

(56) References Cited

U.S. PATENT DOCUMENTS

| 2007/0023689 A1* | 2/2007 | Iizuka | .................... B82Y 10/00 250/492.22 |
| 2013/0037724 A1* | 2/2013 | Tsuruta | ............... H01J 37/3045 250/397 |
| 2013/0177855 A1* | 7/2013 | Nakada | ............... H01J 37/3174 430/296 |
| 2014/0166869 A1* | 6/2014 | Nakada | .................. B82Y 40/00 250/252.1 |

FOREIGN PATENT DOCUMENTS

JP 2011-066054 A 3/2011

* cited by examiner

*Primary Examiner* — Michael Maskell
(74) *Attorney, Agent, or Firm* — Patterson & Sheridan, LLP

(57) ABSTRACT

A writing apparatus includes a writing unit to include a deflector for deflecting a charged particle beam and write a pattern on a target object by the charged particle beam, a decision unit to decide a representative position of a deflection result range in which the charged particle beam was deflected with respect to a writing direction by the deflector, and a correction unit to correct drift of the charged particle beam by using a drift amount at the representative position of the deflection result range.

10 Claims, 11 Drawing Sheets

METHOD FOR CORRECTING DRIFT OF CHARGED PARTICLE BEAM, AND CHARGED PARTICLE BEAM WRITING APPARATUS

CROSS-REFERENCE TO RELATED APPLICATION

This application is based upon and claims the benefit of priority from the prior Japanese Patent Application No. 2014-056400 filed on Mar. 19, 2014 in Japan, the entire contents of which are incorporated herein by reference.

BACKGROUND OF THE INVENTION

Field of the Invention

Embodiments of the present invention relate generally to a method for correcting drift of a charged particle beam and a charged particle beam writing apparatus, and more specifically, relate to, for example, a method for correcting position drift of an electron beam in a writing apparatus that writes a predetermined pattern on a target object with electron beams.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a high-precision master pattern.

FIG. 11 is a conceptual diagram explaining operations of a variable-shaped electron beam writing or "drawing" apparatus. The variable-shaped electron beam (EB) writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" placed on a stage which continuously moves in one predetermined direction (e.g., the x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

When writing is started, for example, a reflected electron is generated by irradiation of electron beams onto a target object. The generated reflected electron collides with the optical system of a writing apparatus, a sensor, etc., and is charged up to generate a new electric field. Then, the trajectory of the electron beam deflected toward the target object is changed by the generated new electric field. Therefore, at the time of writing, change of the trajectory of the electron beam, namely beam position drift, occurs due to the factor described above as an example. Since beam position drift is not constant, it is difficult to correct drift by prediction without measuring. Therefore, conventionally, the amount of beam position drift is measured and corrected at intervals of a certain period of time (refer to, e.g., Japanese Patent Application Laid-open No. 2011-066054).

For measuring the amount of beam position drift, conventionally, a positional deviation amount at the center of the deflection region of the deflector which deflects the beam is measured. However, there is a problem in that, in association with recent miniaturization of patterns, even if drift correction is performed based on the measured result by the conventional method, correction residue remains. Therefore, it is difficult to perform highly accurate writing. Hence, with recent miniaturization and higher integration of patterns, there is necessity of further reducing the amount of positional deviation due to beam position drift. However, conventionally, an effective method has not been established.

BRIEF SUMMARY OF THE INVENTION

According to one aspect of the present invention, a drift correction method for correcting drift of a charged particle beam includes deciding a representative position of a deflection result range in which the charged particle beam was deflected with respect to a writing direction by a deflector, and correcting drift of the charged particle beam by using a drift amount at the representative position of the deflection result range.

According to another aspect of the present invention, a charged particle beam writing apparatus includes a writing unit configured to include a deflector for deflecting a charged particle beam and write a pattern on a target object by the charged particle beam, a decision unit configured to decide a representative position of a deflection result range in which the charged particle beam was deflected with respect to a writing direction by the deflector, and a correction unit configured to correct drift of the charged particle beam by using a drift amount at the representative position of the deflection result range.

DETAILED DESCRIPTION OF THE INVENTION

In the embodiments described below, there will be described a configuration in which an electron beam is used as an example of a charged particle beam. The charged particle beam is not limited to the electron beam, and other charged particle beam such as an ion beam may also be used. Moreover, a variable-shaped electron beam writing apparatus will be described as an example of a charged particle beam apparatus.

In the embodiments described below, a writing apparatus and method capable of sufficiently accurately correcting beam position drift will be described.

First Embodiment

Figure 1:
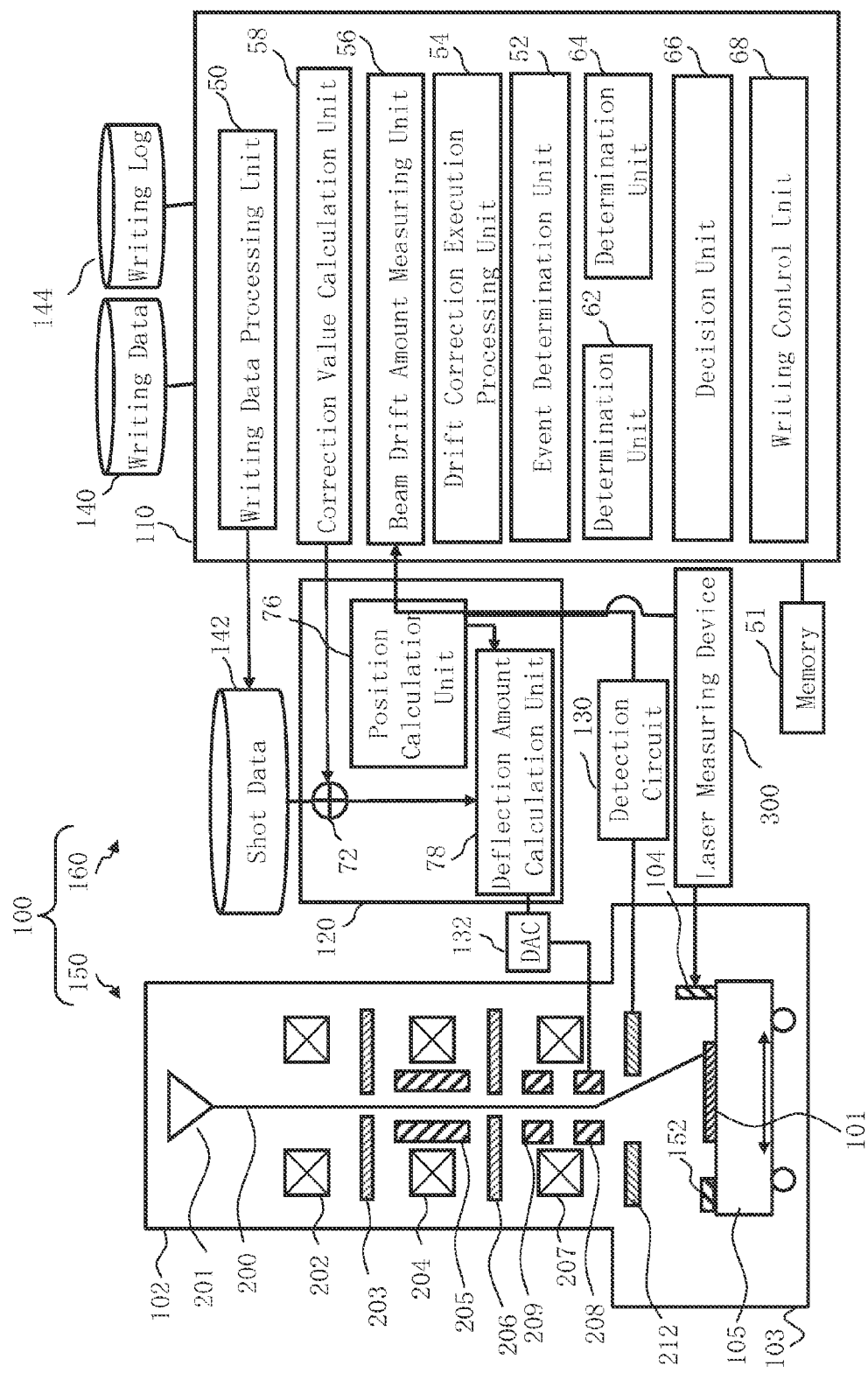
FIG. 1 is a schematic diagram showing a configuration of a writing apparatus according to a first embodiment.

FIG. 1 is a schematic diagram showing the configuration of a writing apparatus according to the first embodiment. In FIG. 1, a writing (or "drawing") apparatus 100 includes a writing unit 150 and a control unit 160. The writing apparatus 100 is an example of a charged particle beam writing apparatus, and, particularly, is an example of a variable-shaped electron beam writing apparatus. The writing unit 150 includes an electron optical column 102 and a writing chamber 103. In the electron optical column 102, there are arranged an electron gun assembly 201, an illumination lens 202, a first aperture plate 203, a projection lens 204, a deflector 205, a second aperture plate 206, an objective lens 207, a main deflector 208, a sub deflector 209, and a detector 212. In the writing chamber 103, an XY stage 105 is arranged. A target object or "sample" 101 to be written, such as a mask, is placed on the XY stage 105. The target object 101 is, for example, an exposure mask used for manufacturing semiconductor devices. Moreover, the target object 101 may be, for example, a mask blank on which no pattern has yet been written. On the XY stage 105, a mark 152 is arranged at a position different from the position where the target object 101 is arranged. Moreover, on the XY stage 105, a mirror 104 is arranged at a position different from the position where the target object 101 is arranged.

The control unit 160 includes a memory 51, a control computer 110, a deflection control circuit 120, a detection circuit 130, a digital/analog converter (DAC) amplifier 132, storage devices 140, 142, and 144, such as magnetic disk drives, and a laser measuring device 300. The memory 51, the control computer 110, the deflection control circuit 120, the detection circuit 130, storage devices 140, 142 and 144, and the laser measuring device 300 are mutually connected through a bus (not shown). The DAC amplifier 132 is connected to the deflection control circuit 120.

In the control computer 110, there are arranged a writing data processing unit 50, an event determination unit 52, a drift correction execution processing unit 54, a beam drift amount measuring unit 56, a correction value calculation unit 58, determination units 62 and 64, a decision unit 66, and a writing control unit 68. Functions, such as the writing data processing unit 50, the event determination unit 52, the drift correction execution processing unit 54, the beam drift amount measuring unit 56, the correction value calculation unit 58, the determination units 62 and 64, the decision unit 66, and the writing control unit 68 may be configured by hardware such as an electric circuit or by software such as a program causing a computer to implement these functions. Alternatively, the functions may be configured by a combination of hardware and software. Data which is input and output to/from the writing data processing unit 50, the event determination unit 52, the drift correction execution processing unit 54, the beam drift amount measuring unit 56, the correction value calculation unit 58, the determination units 62 and 64, the decision unit 66, and the writing control unit 68, and data being operated are stored in the memory 51 each time.

In the deflection control circuit 120, there are arranged an adder 72, a position calculation unit 76, and a deflection amount calculation unit 78. Functions, such as the adder 72, the position calculation unit 76, and the deflection amount calculation unit 78 may be configured by hardware such as an electric circuit or by software such as a program causing a computer to implement these functions. Alternatively, the functions may be configured by a combination of hardware and software. Data which is input and output to/from the adder 72, the position calculation unit 76, and the deflection amount calculation unit 78, and data being operated are stored in a memory (not shown) each time.

Writing data serving as layout data is input from the outside of the apparatus and stored in the storage device 140. For example, chip data of chip A, chip data of chip B, chip data of chip C, and so forth are stored. Patterns are formed on each chip.

FIG. 1 shows a configuration necessary for explaining the first embodiment. Other configuration elements generally necessary for the writing apparatus 100 may also be included. For example, although the main deflector 208 is herein used for deflecting positions, a multiple stage deflector of two stages of the main deflector and the sub deflector may also be preferably used. Alternatively, a multiple stage deflector of three or more stages may also be preferably used for deflecting positions.

Figure 2:
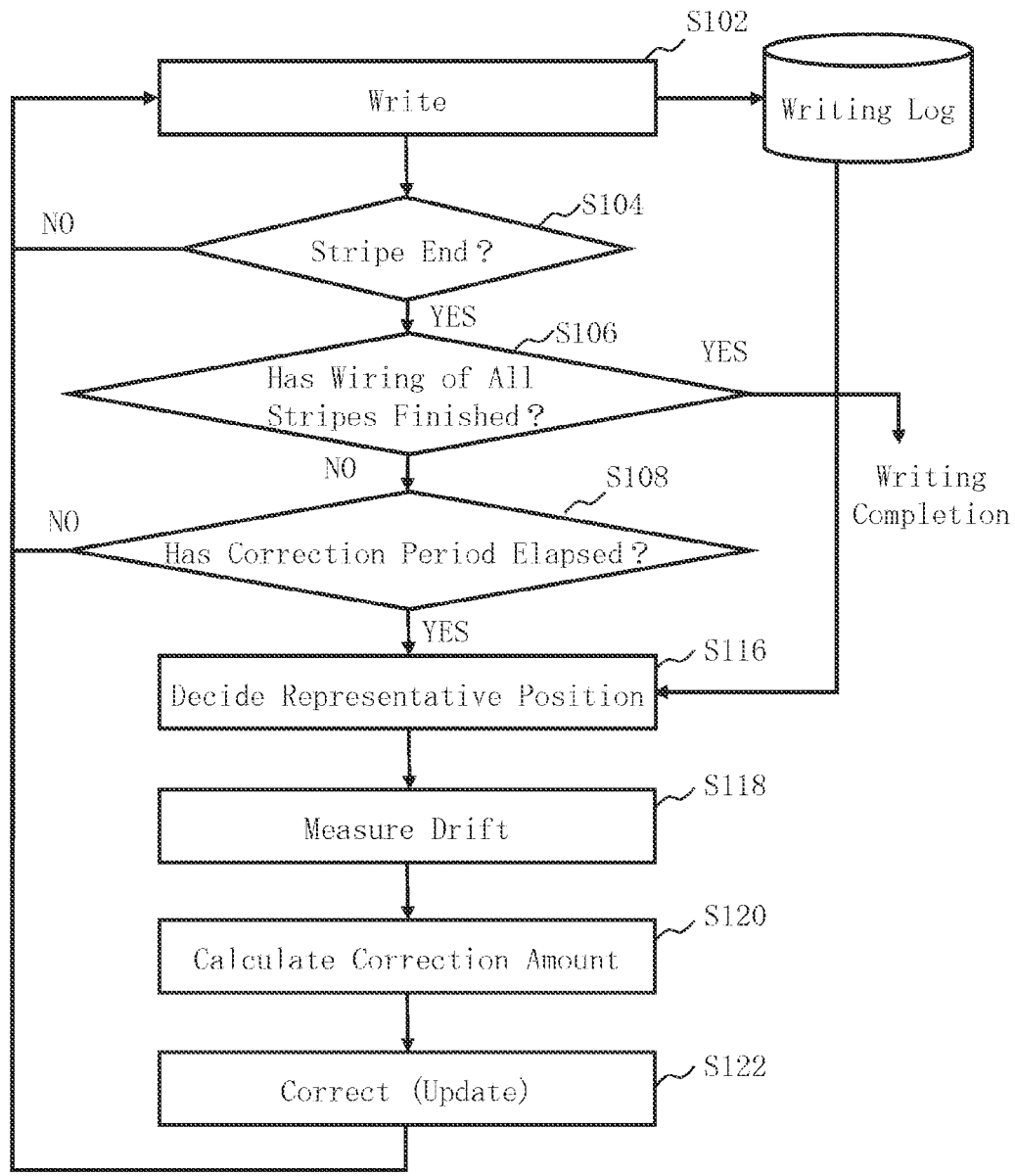
FIG. 2 is a flowchart showing main steps of a writing method according to the first embodiment.

FIG. 2 is a flowchart showing main steps of a writing method according to the first embodiment. In FIG. 2, the writing method of the first embodiment executes a series of steps: a writing step (S102), a determination step (S104), a determination step (S106), a determination step (S108), a representative position decision step (S116), a drift measurement step (S118), a correction amount calculation step (S120), and a correction step (S122). Moreover, the determination steps (S104), (S106), and (S108), the representative position decision step (S116), the drift measurement step (S118), the correction amount calculation step (S120), and the correction step (S122) indicate main steps of a method for correcting drift of an electron beam according to the first embodiment.

In the writing step (S102), first, the writing data processing unit 50 reads writing data from the storage device 140, and performs data conversion processing of a plurality of steps so as to generate shot data having a format unique to the writing apparatuses 100. In order to write figure patterns by the writing apparatus 100, it is necessary to divide each figure pattern defined in the pattern data of a chip into the size that can be irradiated by one beam shot. Then, for actually performing writing, the writing data processing unit 50 generates a shot figure by dividing each figure pattern into the size that can be irradiated by one beam shot. Shot data is generated for each shot figure. The shot data defines figure data, such as a figure type, a figure size, and an irradiation position. In addition, an irradiation time in accordance with a dose is also defined. Generated shot data is sorted in the storage device 142, and writing is to be performed using the shot data.

Under the control of the writing control unit 69, the deflection control circuit 120 reads the shot data from the storage device 142. Then, a drift correction amount is added by the adder 72 to the position of a shot figure shown by the shot data. The drift correction amount may not be prepared at the beginning, or it may be calculated before writing by the same method as that described later. The position of the XY stage 105 is measured by the laser measuring device 300 by emitting laser from the laser measuring device 300 to the mirror 104 to receive reflected light therefrom. The measured result is output to the position calculation unit 76, and a reference position of the writing coordinate system is calculated by the position calculation unit 76. Using position data of a shot figure after being added by the adder 72 and reference position data of the writing coordinate system, the deflection amount calculation unit 78 calculates a deflection amount equivalent to a deflection voltage, and outputs a deflection amount signal being a digital signal to the DAC amplifier 132. In the DAC amplifier 132, the digital signal indicating the deflection amount is converted to an analog signal and amplified to be applied as a deflection voltage to the main deflector 208.

The writing unit 150 writes a pattern on the target object 101 with the electron beam 200. Specifically, it operates as described below. The electron beam 200 emitted from the electron gun assembly 201 irradiates the whole of the first aperture plate 203 having a quadrangular opening by the illumination lens 202. Here, the electron beam 200 is first shaped to a quadrangle. Then, after having passed through the first aperture plate 203, the electron beam 200 of the first aperture image is projected onto the second aperture plate 206 by the projection lens 204. The position of the first aperture image on the second aperture plate 206 is deflection controlled by the deflector 205 so as to change (variably shape) the beam shape and the beam size. Then, after having passed through the second aperture plate 206, the electron beam 200 of the second aperture image is focused by the objective lens 207, and deflected by the main deflector 208 and the sub deflector 209 controlled by the deflection control circuit 120, to reach a desired position on the target object 101 placed on the XY stage 105 movably arranged.

Figure 3:
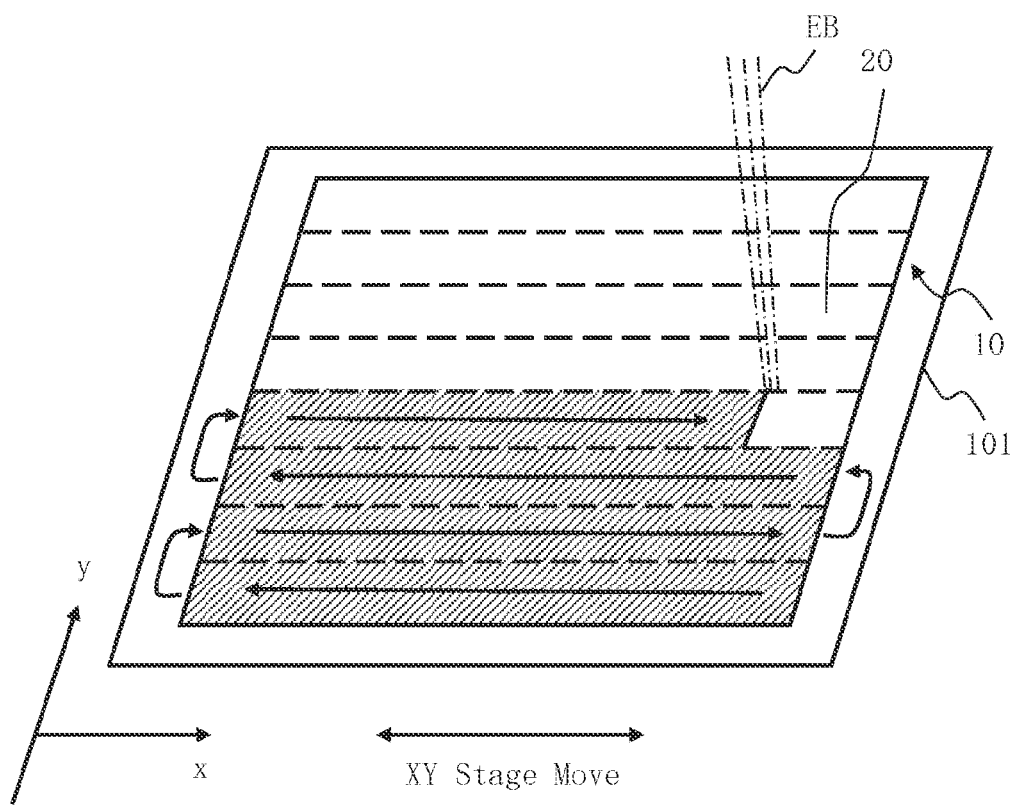
FIG. 3 illustrates movement of an XY stage according to the first embodiment.

FIG. 3 illustrates the movement of the XY stage according to the first embodiment. In FIG. 3, a writing region 10 of the target object 101 is virtually divided into a plurality of strip-shaped stripe regions 20 arrayed along the y direction, for example, by the width deflectable by the main deflector 208. Then, each stripe region 20 is virtually divided into a plurality of mesh-like subfields (SF) (small regions) (not shown) by the size deflectable by the sub deflector 209. A shot figure corresponding to each shot position in each SF is written.

The writing apparatus 100 performs writing processing for each stripe region by using a multi-stage deflector. In this case, a two-stage deflector composed of the main deflector 208 and the sub deflector 209 is used as an example. While the XY stage 105 is continuously moving in the −x direction, for example, writing is performed in the x direction in the first stripe region 20. After the first stripe region 20 has been written, writing is performed in the same direction or in the opposite direction in the second stripe region 20. Then, similarly, writing is performed in the third and subsequent stripe regions 20. The main deflector 208 deflects the electron beam 200, in order, to a reference position of SF such that the movement of the XY stage 105 is followed. The sub deflector 209 deflects the electron beam 200 from the reference position of each SF to each shot position of an irradiating beam in the SF 30 concerned. Thus, the main deflector 208 and the sub deflector 209 have different size deflection regions.

In the determination step (S104), the determination unit 62 determines whether the writing processing position which is currently being written is a terminated position of one of the stripe regions 20. In the case of the terminated position, it proceeds to the determination step (S106). In the case of not being a terminated position, it returns to the writing step (S102).

In the determination step (S106), the determination unit 64 determines whether writing of all the plurality of stripe regions 20 has been completed. If writing of all the stripe regions 20 has not been completed, it proceeds to the determination step (S108). If writing of all the stripe regions 20 has been completed, the writing processing ends.

In the determination step (S108), the event determination unit 52 determines whether a predetermined correction period has elapsed since the last drift correction. When a predetermined correction period has elapsed, it proceeds to the representative position decision step (S116). When the predetermined correction period has not elapsed, it returns to the writing step (S102).

Figure 4:
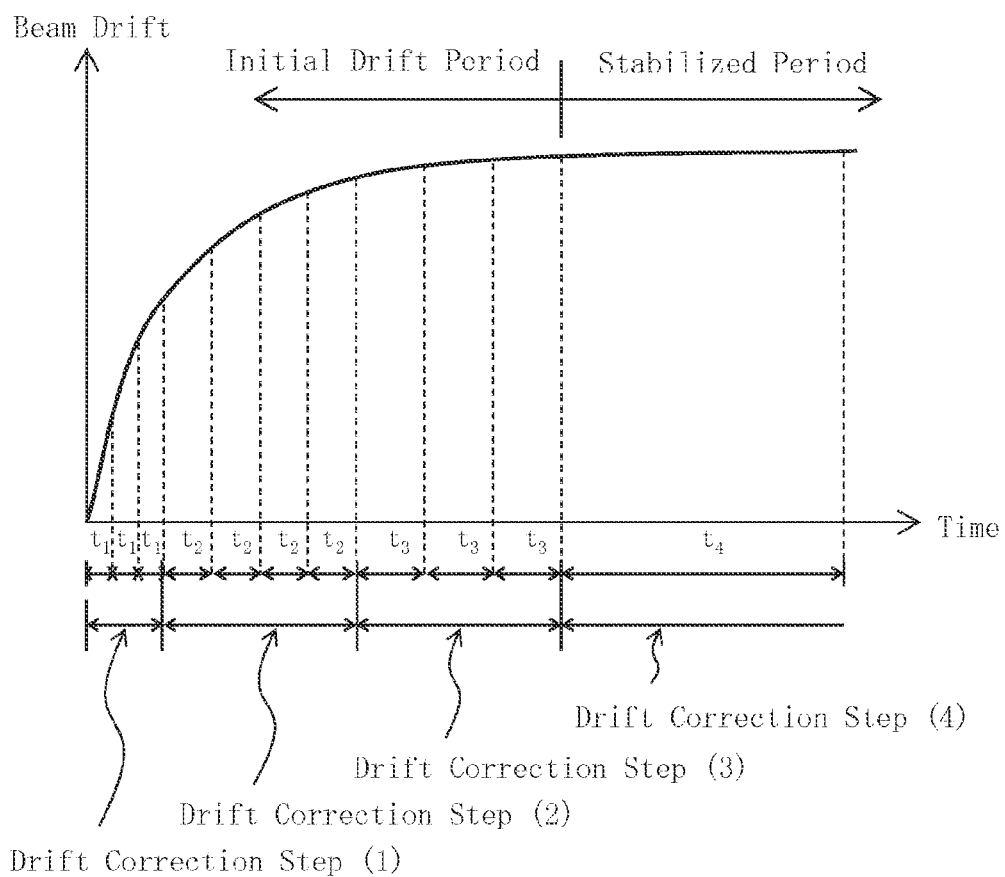
FIG. 4 shows the relation between beam drift and time according to the first embodiment.

FIG. 4 shows the relation between beam drift and time according to the first embodiment. When irradiation of the electron beam 200 is started, beam drift occurs in the electron beam. As shown in FIG. 4, immediately after starting the irradiation, beam drift (initial drift) takes place by the beam's own attributes or due to the starting irradiation of the electron beam. There is a tendency that the amount of change of beam drift is large in the initial drift occurrence period, and the change amount gradually becomes small with the lapse of time. In FIG. 4, the range in which the amount of change is small is shown as a stabilized period.

In view of this, according to the first embodiment, the interval of correcting beam position drift is set to be short immediately after starting irradiation, i.e., immediately after staring writing, which is the time with large change amount of beam drift. Then, as writing progresses with the lapse of time, the interval of correcting beam position drift is set to be longer. In the example of FIG. 4, in a drift correction step (1), beam position drift correction is periodically performed three times at intervals of t1. Then, in a drift correction step (2), drift correction is done four times at intervals of t2 being longer than t1. Then, in a drift correction step (3), drift correction is done three times at intervals of t3 being longer than t2. Finally, in a drift correction step (4), drift correction is done at intervals of t4 being longer than t3. For example, at the drift correction step (1), since the initial beam drift is large, the period t1 of correction interval is set to be five minutes. In the drift correction step (2), since beam drift decreases to some extent, the period t2 of correction interval is set to be ten minutes. In the drift correction step (3), since beam drift further decreases, the period t3 of correction interval is set to be thirty minutes. In the drift correction step (4), since there is almost no beam drift, the period t4 of correction interval is set to be sixty minutes. Here, the number of drift correction steps may be arbitrary depending upon the consideration which is most optimal. Besides, the length of the period t of each drift correction step may also be arbitrary depending upon the consideration which is most optimal. Further, the number of times of correction in each drift correction step may be arbitrary depending upon the consideration which is most optimal.

In the representative position decision step (S116), the decision unit 66 decides a representative position of a deflection result range in which an electron beam was deflected with respect to the writing direction by the main deflector 208 in the past. The deflection result range is stored and accumulated as a writing log in the storage device 144, in the writing step (S102). According to the first embodiment, drift correction is performed using a deflection position of the main deflector 208. Therefore, the writing log concerning the main deflector 208 is herein used.

Figure 5:
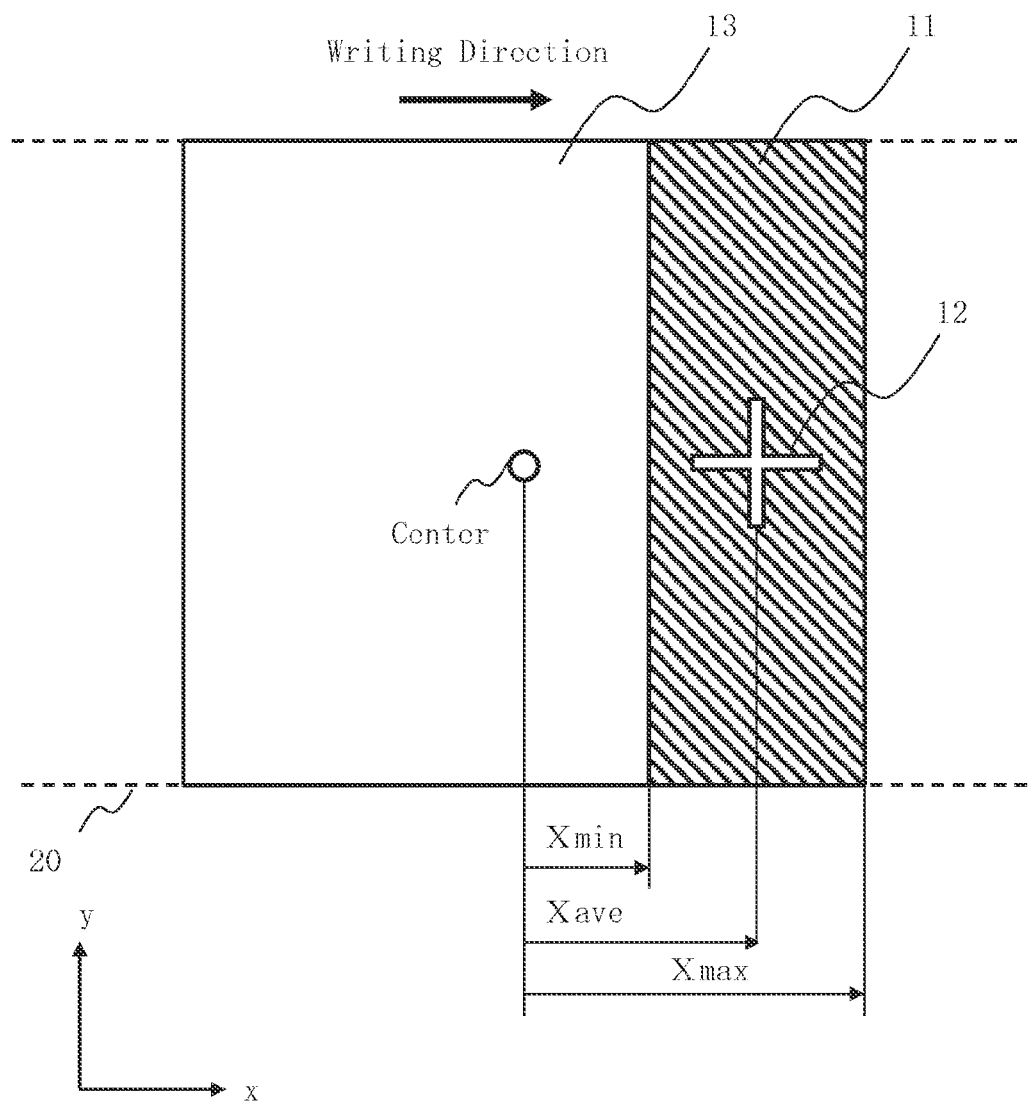
FIG. 5 shows an example of a deflection result and a representative position of a main deflector according to the first embodiment.

FIG. 5 shows an example of the deflection result and the representative position of the main deflector according to the first embodiment. In the writing log, a maximum deflection position Xmax and a minimum deflection position Xmin having been used for actual writing processing and being distanced from the center of a deflection region 13 of the main deflector 208 are recorded. In the writing apparatus 100 of VSB (variable shaped beam) type, in many cases, only a portion of the deflection region 13, for example, only a portion at the writing direction side of the deflection region 13 is used. Therefore, the maximum deflection position Xmax and the minimum deflection position Xmin in the writing direction (x direction) from the center of the deflection region 13 are defined in the writing log. The deflection result range indicates deflection toward an SF (sub field) at the position between the maximum deflection position Xmax and the minimum deflection position Xmin in the writing direction (x direction). Based on the fact that SFs are fully arranged with respect to the y direction orthogonal to the writing direction (x direction), it means there is a deflection result in the y direction of the main deflector 208 as long as there exists no SF without a pattern. Therefore, when the maximum deflection position Xmax and the minimum deflection position Xmin in the x direction are identified, a deflection result region 11 of the main deflector can be acquired.

A drift amount is conventionally measured and corrected at the central position of the deflection region 13 of the main deflector 208, not at the deflection result region 11, and thus, the correction has been executed at the position different from an actual deflection position. Therefore, even when drift correction is executed, a correction residue remains. Then, according to the first embodiment, drift correction is performed at a representative position 12, which is in the deflection result range 11 where the main deflector 208 actually performed beam deflection for writing. In the case of FIG. 5, for example, the central position of the deflection result range 11 is regarded as the representative position 12 to perform drift correction. When using the central position of the deflection result range 11 as the representative position 12, the x-direction position of the central position can be obtained by calculating an average position Xave of the maximum deflection position Xmax and the minimum deflection position Xmin in the x direction. With respect to the y-direction position of the central position, the original y-direction center position of the deflection region 13 of the main deflector 208 can be used.

In the drift measurement step (S118), the beam drift amount measuring unit 56 measures the amount of drift of the electron beam 200, at the representative position 12 of the deflection result range 13.

Figure 6:
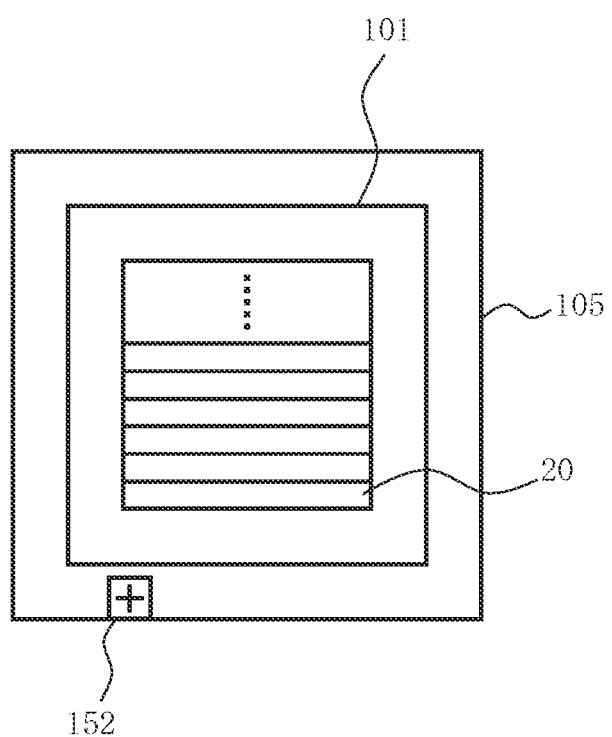
FIG. 6 is a conceptual diagram of the upper surface of the XY stage according to the first embodiment.

FIG. 6 is a conceptual diagram of the upper surface of the XY stage according to the first embodiment. As shown in FIG. 6, on the XY stage 105 where the target object 101 is to be placed, the mark 152 for inspecting the amount of beam drift of the electron beam 200 is provided. The mark 152 is formed in the shape of a cross, for example, so that the position can be easily detected by scanning by the electron beam 200. In the example of FIG. 6, the mirror 104 of FIG. 1 is omitted. Specifically, first, with respect to beam position drift correction, the drift correction execution processing unit 54 outputs an execution instruction (command) to execute (start) operations for beam drift correction and makes each control circuit operate.

In the writing apparatus 100, receiving the execution instruction, the XY stage 105 is moved so that the mark 152 for beam calibration provided on the XY stage 105, independently from the target object 101, may be in accordance with the representative position 12 in the deflection region 13 being displaced from the center position of the objective lens 207. The cross of the mark 152 is scanned by the electron beam 200 having been deflected to the front, back, right and left (in the x and y directions) of the representative position 12 by the main deflector 208 so that a reflected electron from the mark 152 may be detected by the detector 212 and amplified by the detection circuit 130 to be converted to digital data. Then, the measured data is output to the beam drift amount measuring unit 56. Based on the input measured data on the representative position 12, the beam drift amount measuring unit 56 measures a positional deviation amount deviated from a deflection position, which is set at the representative position 12, as a drift amount of the electron beam 200.

In the correction amount calculation step (S120), the correction value calculation unit 58 (correction amount calculation unit) calculates a correction value (correction amount) for correcting beam position drift, based on the position drift amount measured by the beam drift amount measuring unit 56. For example, the value $(-\Delta x, -\Delta y)$ obtained by reversing the signs of the position drift amount $(\Delta x, \Delta y)$ can be the amount of correction. Then, the correction value is output to the adder 72.

The drift measurement step (S118) and the correction amount calculation step (S120) are carried out after writing processing of at least one of a plurality of stripe regions has been completed and before writing of a next stripe region is started.

In the correction step (S122), the correction value having been output to the adder 72 overwrites an existing correction value in the storage device (not shown) to update the correction value. According to what is described above, a correction amount for correcting the amount of beam position drift has been set. Then, it returns to the writing step (S102). The drift of the electron beam is corrected when the first stripe region is written after the correction amount has been calculated.

In the writing step (S102), when writing is performed in a next stripe region 20, drift correction is executed using an updated correction value. Specifically, beam position drift is corrected by rewriting design data by adding and combining data of an original design value obtained from shot data and data of a correction value by the adder 72. Using position data of a shot figure after being added by the adder 72 and reference position data of the writing coordinate system calculated by the position calculation unit 76, the deflection amount calculation unit 78 calculates a deflection amount equivalent to a deflection voltage, and outputs a deflection amount signal being a digital signal to the DAC amplifier 132. In the DAC amplifier 132, the digital signal indicating a deflection amount is converted to an analog signal and amplified to be applied as a deflection voltage to the main deflector 208. As described above, drift of the electron beam 200 is corrected using a drift amount at the representative position 12 in the deflection result range. The other contents of the writing step (S102) are the same as those described above.

As described above, according to the first embodiment, since correction is performed using a positional deviation amount at the representative position 12 of the deflection result range 13, not using a conventionally used positional deviation amount at the center of the deflection region of the deflector for deflecting a beam, beam position drift can be corrected sufficiently accurately.

Second Embodiment

In the first embodiment, the amount of drift is measured at the representative position 12 in the deflection result range 11 of the main deflection region 13. According to the second embodiment, as described below, drift amounts at a plurality of positions in the main deflection region 13 are measured, and correction is performed using a positional deviation amount at a representative position by using the measured result.

Figure 7:
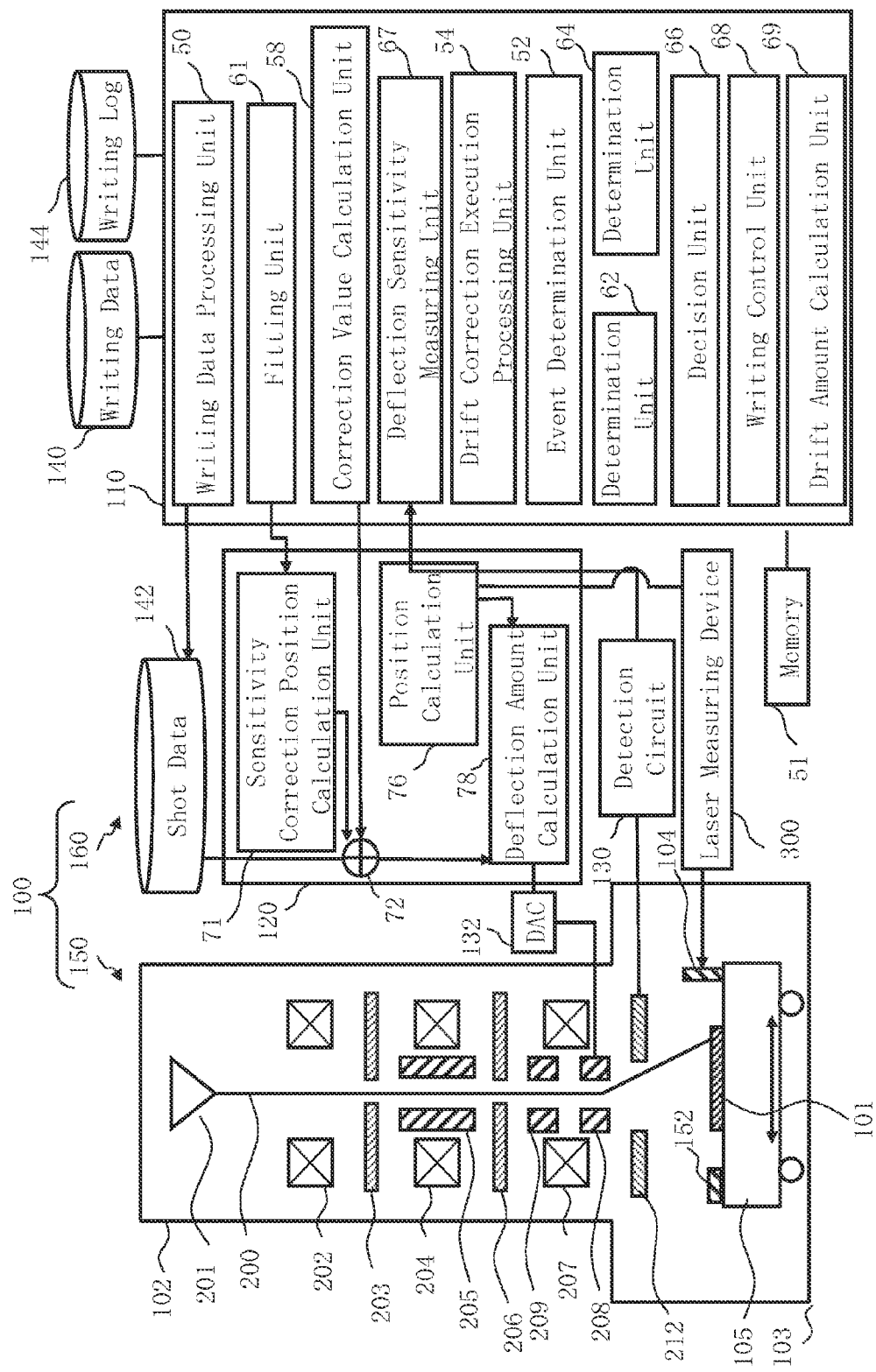
FIG. 7 is a schematic diagram showing a configuration of a writing apparatus according to a second embodiment.

FIG. 7 is a schematic diagram showing the configuration of a writing apparatus according to the second embodiment. FIG. 7 is the same as FIG. 1 except that a fitting unit 61, a deflection sensitivity measuring unit 67, and a drift amount calculation unit 69 are arranged instead of the beam drift amount measuring unit 56 in the control computer 110, and that a sensitivity correction position calculation unit 71 is additionally arranged in the deflection control circuit 120.

Functions in the control computer 110, such as the writing data processing unit 50, the event determination unit 52, the drift correction execution processing unit 54, the correction value calculation unit 58, the fitting unit 61, the determination units 62 and 64, the decision unit 66, the deflection sensitivity measuring unit 67, the writing control unit 68, and the drift amount calculation unit 69 may be configured by hardware such as an electric circuit or by software such as a program causing a computer to implement these functions. Alternatively, the functions may be configured by a combination of hardware and software. Data which is input and output to/from the writing data processing unit 50, the event determination unit 52, the drift correction execution processing unit 54, the correction value calculation unit 58, the fitting unit 61, the determination units 62 and 64, the decision unit 66, the deflection sensitivity measuring unit 67, the writing control unit 68, and the drift amount calculation unit 69, and data being operated are stored in the memory 51 each time.

Functions in the deflection control circuit 120, such as the sensitivity correction position calculation unit 71, the adder 72, the position calculation unit 76, and the deflection amount calculation unit 78 may be configured by hardware such as an electric circuit or by software such as a program causing a computer to implement these functions. Alternatively, the functions may be configured by a combination of hardware and software. Data which is input and output to/from the sensitivity correction position calculation unit 71, the adder 72, the position calculation unit 76, and the deflection amount calculation unit 78, and data being operated are stored in the memory (not shown) each time.

Figure 8:
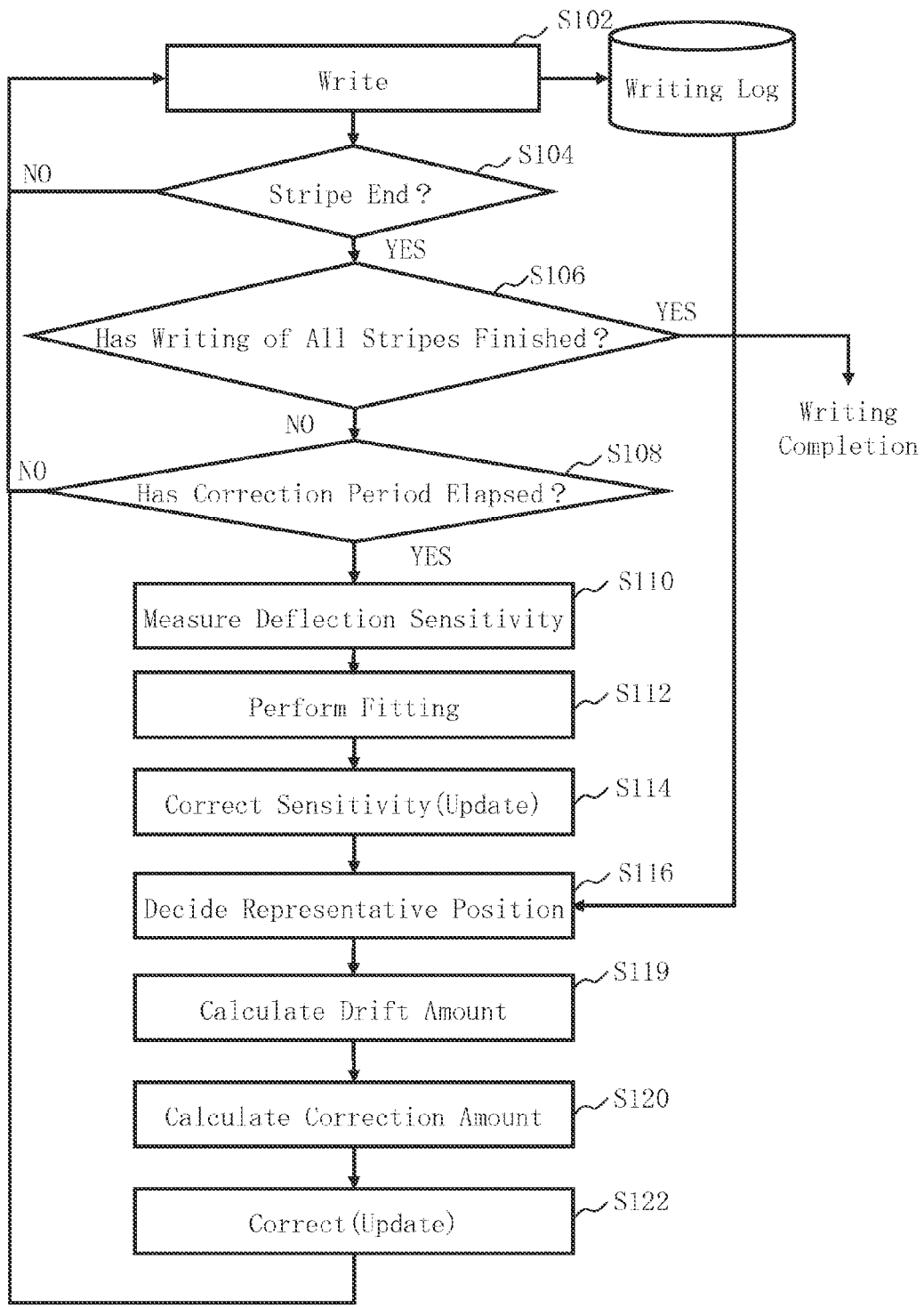
FIG. 8 is a flowchart showing main steps of a writing method according to the second embodiment.

FIG. 8 is a flowchart showing main steps of a writing method according to the second embodiment. FIG. 8 is the same as FIG. 2 except that a deflection sensitivity measurement step (S110), a fitting step (S112), and a sensitivity correction step (S114) are added between the determination step (S108) and the representative position decision step (S116), and that a drift amount calculation step (S119) is provided instead of the drift measurement step (S118). Moreover, the determination steps (S104), (S106), and (S108), the deflection sensitivity measurement step (S110), the fitting step (S112), the sensitivity correction step (S114), the representative position decision step (S116), the drift amount calculation step (S119), the correction amount calculation step (S120), and the correction step (S122) respectively indicate main steps of a method for correcting drift of an electron beam according to the second embodiment. The contents of the present embodiment are the same as those of the first embodiment except what is described below.

The contents of each step from the writing step (S102) to the determination step (S108) are the same those in the first embodiment.

In the deflection sensitivity measurement step (S110), the deflection sensitivity measuring unit 67 measures drift amounts of the electron beam 200 at a plurality of positions in the deflection range 13 of the main deflector 208.

Figure 9:
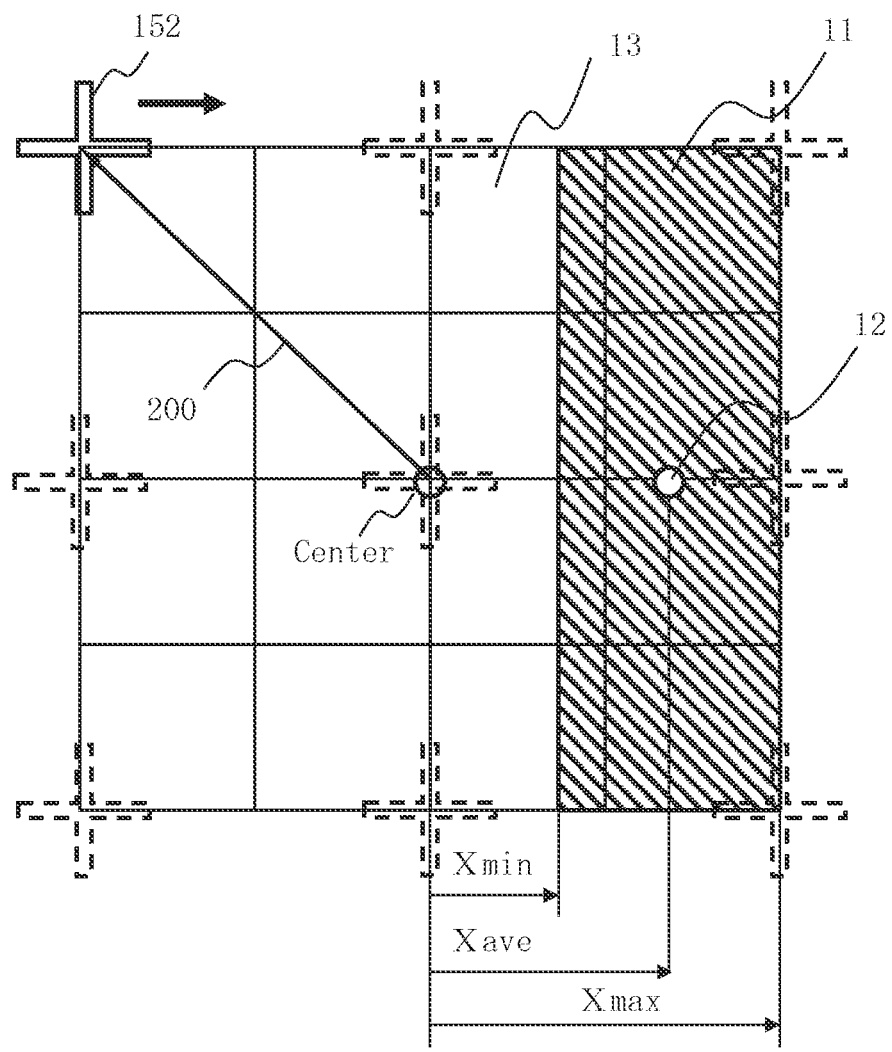
FIG. 9 shows an example of a deflection region of a main deflector, a deflection sensitivity measurement position, a deflection result, and a representative position according to the second embodiment.

FIG. 9 shows an example of the deflection region of the main deflector, the deflection sensitivity measurement position, the deflection result, and the representative position according to the second embodiment. In the case of FIG. 9, the amount of drift of the electron beam 200 is measured at, for example, nine (3×3) positions equally separated from each other in the deflection region 13 of the main deflector 208. Specifically, first, relating to beam position drift correction, the drift correction execution processing unit 54 outputs an execution instruction (command) to execute (start) operations of beam drift correction and makes each control circuit operate. In the writing apparatus 100, as shown in FIG. 9, receiving the execution instruction, the mark 152 is moved to each desired position in the deflection region 13 by moving the XY stage 105. The mark 152 is scanned by the electron beam 200 having been deflected to each position in the deflection region 13 by the main deflector 208 so that a reflected electron from the mark 152 may be detected by the detector 212 and amplified by the detection circuit 130 to be converted to digital data. Then, the measured data is output to the beam drift amount measuring unit 56. Based on the input measured data on each position, the beam drift amount measuring unit 56 respectively measures a positional deviation amount deviated from a corresponding deflection position, which is set at each position, as a corresponding drift amount of the electron beam 200 at each position.

In the fitting step (S112), the fitting unit 61 performs fitting of drift amounts at a plurality of positions in the deflection region 13 of the main deflector 208 in order to acquire an approximate expression. Specifically, fitting (approximation) of a measured positional deviation amount (drift amount) of each position in the deflection region 13 of the main deflector 208 is performed by the following polynomial (1).

$$\Delta x' = a_0 + a_1 x + a_2 y + a_3 x^2 + a_4 xy + a_5 y^2 + a_6 x^3 + a_7 x^2 y + a_8 xy^2 + a_9 y^3$$

$$\Delta y' = b_0 + b_1 x + b_2 y + b_3 x^2 + b_4 xy + b_5 y^2 + b_6 x^3 + b_7 x^2 y + b_8 xy^2 + b_9 y^3 \quad (1)$$

An approximate expression is obtained by the fitting. In other words, coefficient $a_0$ to $a_9$, and $b_0$ to $b_9$ of the approximate expression are calculated. Then, coefficients of the first and more order terms in the calculated coefficients, excluding the 0th order term (coefficients $a_0$ and $b_0$), are output as sensitivity correction coefficients to the deflection control circuit 120.

Figure 10:
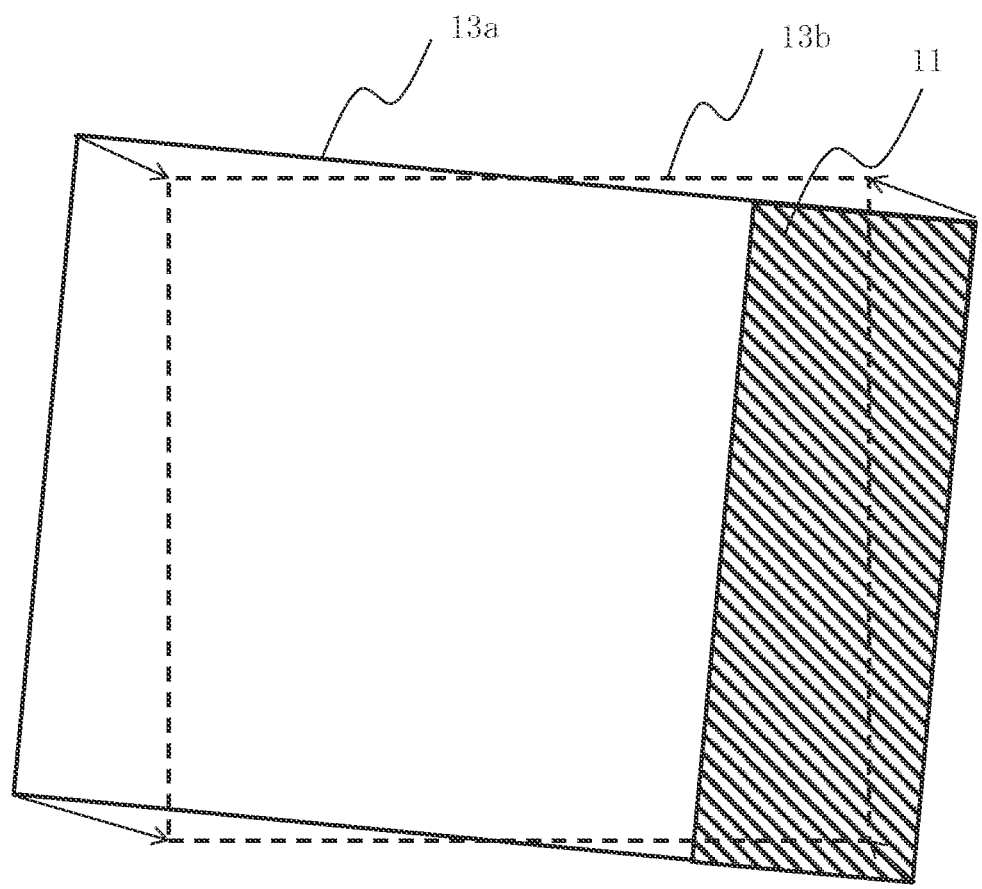
FIG. 10 shows an example of a main deflection region before and after correcting deflection sensitivity according to the second embodiment.
Figure 11:
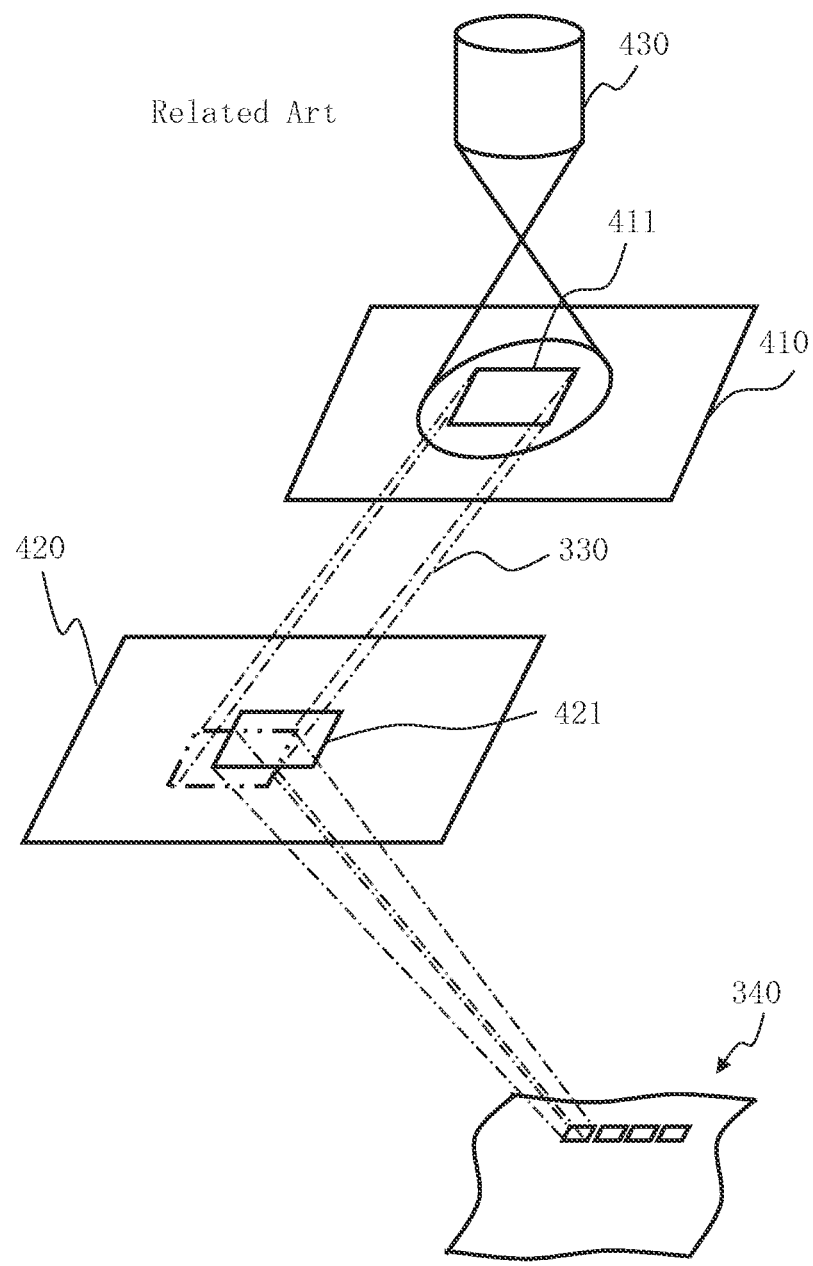
FIG. 11 is a conceptual diagram explaining operations of a variable-shaped electron beam writing apparatus.

FIG. 10 shows an example of the main deflection region before and after correcting deflection sensitivity according to the second embodiment. As shown in FIG. 10, referring to a result of measurement, a deflection region 13b of the main deflector 208 before the correction deviates to a deflection region 13a. Therefore, the deflection sensitivity of the main deflector 208 can be corrected by correcting the positional deviation by an approximate expression.

In the sensitivity correction step (S114), a sensitivity correction coefficient having been output to the sensitivity correction position calculation unit 71 is added to a current sensitivity correction coefficient stored in the storage device (not shown) so as to update the sensitivity correction coefficient.

In the representative position decision step (S116), the decision unit 66 decides the representative position 12 of the deflection result range 11 in which the electron beam 200 was deflected with respect to the writing direction by the main deflector 208. The method of deciding the representative position 12 is the same as that of the first embodiment. Therefore, as shown in FIG. 9, in the second embodiment as with the first embodiment, the central position of the deflection result range 11 is decided as the representative position 12.

In the drift amount calculation step (S119), the amount calculation unit 69 calculates a positional deviation amount (drift amount) of the electron beam 200 at the representative position 12, using the approximate expression acquired in the fitting step (S112).

The contents of the correction amount calculation step (S120) and the correction step (S122) are the same as those of the first embodiment.

According to what is described above, correction amounts for correcting a deflection sensitivity and a beam position drift amount have been set. Then, it returns to the writing step (S102).

In the writing step (S102), when writing is performed in a next stripe region 20, deflection sensitivity correction is executed using an updated correction value and drift correction is executed using an updated correction value. Specifically, the deflection control circuit 120 reads shot data from the storage device 142, and, the sensitivity correction position calculation unit 71 calculates a positional deviation amount ($\Delta x'$, $\Delta y'$) after deviation of deflection sensitivity, by substituting the position (x, y) of the shot figure indicated by the shot data into an approximate expression.

Next, a correction amount ($-\Delta x'$, $-\Delta y'$) of the positional deviation amount ($\Delta x'$, $\Delta y'$) after deviation of deflection sensitivity and a drift correction amount are added by the adder 72 to the position (x, y) of the shot figure indicated by shot data. Using position data of the shot figure after being added by the adder 72 and reference position data of the writing coordinate system calculated by the position calculation unit 76, the deflection amount calculation unit 78 calculates a deflection amount equivalent to a deflection voltage, and outputs a deflection amount signal being a digital signal to the DAC amplifier 132. In the DAC amplifier 132, the digital signal indicating the deflection amount is converted to an analog signal and amplified to be applied as a deflection voltage to the main deflector 208. As described above, the position drift of the electron beam 200 is corrected with the main deflection sensitivity by calculating a drift amount at the representative position 12 of the deflection result range from a measured value for deflection sensitivity correction. The other contents of the writing step (S102) are the same as those described above.

As described above, according to the second embodiment, since correction is performed using a positional deviation amount at the representative position 12 of the deflection result range 13, not using a conventionally used positional deviation amount at the center of the deflection region of the main deflector for deflecting a beam, beam position drift can be corrected sufficiently accurately.

Although in each Embodiment described above the drift amount (and the drift correction amount) at the representative position 12 is calculated using a measured value of one stripe region 20, it is not limited thereto. As described above, the electron beam 200 irradiates, in order, each of a plurality of stripe regions 20 obtained by virtually dividing the target object 101 serving as a writing target. Then, it is also preferable that drift of the electron beam 200 is corrected using an average value of drift amounts, each at the representative position 12 of each deflection result range 11 of electron beam deflection, in two or more stripe regions 20 having been irradiated by the electron beam 200 in a plurality of stripe regions 20. Correction accuracy can be increased by using an average value of a plurality of stripe regions 20.

Although a portion of the front part, with respect to the writing direction, of the deflection result range 11 is shown in FIG. 5, it is not limited thereto. It may be the central part, or the back part. Relating the case of the central part, since the representative position 12 is close to the center of the main deflection region 13, it is assumed that the drift correction residue generated by the conventional method is small. However, actually, there is little possibility for the deflection result range 11 to be the central part of the main deflection region 13. Therefore, it may be displaced to the front or back. Particularly, there is a high possibility of being displaced to the front part. That is why, by daringly obtaining the deflection result range 11 and selecting its representative position, it becomes possible to further increase the correction accuracy.

The embodiments have been explained referring to concrete examples described above. However, the present invention is not limited to these specific examples.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other drift correction method of a charged particle beam, charged particle beam writing apparatus and charged particle writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A drift correction method for correcting drifts of a charged particle beam comprising:

determining a representative position of a deflection result range in which the charged particle beam was deflected with respect to a writing direction by a deflector during past writing on a target object, the deflection result range being a range on a surface to be written in the writing direction; and correcting drift of the charged particle beam based on a drift amount at the representative position of the deflection result range.

2. The method according to claim 1, further comprising:
measuring the drift amount of the charged particle beam at the representative position of the deflection result range.

3. The method according to claim 1, further comprising:
measuring drift amounts of the charged particle beam at a plurality of positions in a deflection range of the deflector;
performing fitting of the drift amounts at the plurality of positions in order to acquire an approximate expression; and
calculating a drift amount of the charged particle beam at the representative position based on the approximate expression.

4. The method according to claim 1, wherein
the charged particle beam irradiates, in order, each of a plurality of stripe regions obtained by virtually dividing a target object serving as a writing target, and
the drift of the charged particle beam is corrected using an average value of drift amounts at representative positions of each deflection result range in which the charged particle beam was deflected, in at least two stripe regions having been irradiated by the charged particle beam in the plurality of stripe regions.

5. The method according to claim 1, further comprising:
calculating a correction amount for correcting drift of the charged particle beam based on the drift amount at the representative position of the deflection result range.

6. The method according to claim 5, further comprising:
writing a pattern on a target object by the charged particle beam, wherein:
a writing region of the target object is virtually divided into a plurality of stripe regions,
writing processing is performed in each stripe region of the plurality of stripe regions, and
the drift amount of the charged particle beam is measured after the writing processing has been completed for at least one of the plurality of stripe regions and before starting the writing processing for a next stripe region.

7. The method according to claim 6, wherein
the correction amount is calculated after the writing processing has been completed for at least one of the plurality of stripe regions and before starting the writing processing for a next stripe region.

8. The method according to claim 7, wherein
the drift of the charged particle beam is corrected when a first stripe region is written after the correction amount has been calculated.

9. A charged particle beam writing apparatus comprising:
a writing unit that includes a deflector for deflecting a charged particle beam and write a pattern on a target object by the charged particle beam;
a decision unit configured to determine a representative position of a deflection result range in which the charged particle beam was deflected with respect to a writing direction by the deflector during past writing on a target object, the deflection result range being a range on a surface to be written in the writing direction; and
a correction unit configured to correct drift of the charged particle beam based on a drift amount at the representative position of the deflection result range.

10. The apparatus according to claim 9, further comprising:
a correction amount calculation unit configured to calculate a correction amount for correcting the drift of the charged particle beam based on the drift amount at the representative position of the deflection result range.

* * * * *